United States Patent
Arai

(10) Patent No.: US 8,013,683 B2
(45) Date of Patent: Sep. 6, 2011

(54) CONSTANT-TEMPERATURE TYPE CRYSTAL OSCILLATOR

(75) Inventor: Junichi Arai, Saitama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 67 days.

(21) Appl. No.: 12/584,192

(22) Filed: Sep. 1, 2009

(65) Prior Publication Data
US 2010/0052802 A1    Mar. 4, 2010

(30) Foreign Application Priority Data

Sep. 2, 2008   (JP) ................... 2008-224560

(51) Int. Cl.
*H03L 1/00*   (2006.01)
(52) U.S. Cl. ....... 331/176; 331/66; 331/158; 331/116 R; 331/116 FE
(58) Field of Classification Search .............. 331/176, 331/66, 158, 116 R, 116 FE
See application file for complete search history.

(56) References Cited

U.S. PATENT DOCUMENTS

| 6,147,565 | A | 11/2000 | Satoh et al. | |
|---|---|---|---|---|
| 7,345,552 | B2 * | 3/2008 | Ito et al. | 331/69 |
| 7,821,346 | B2 * | 10/2010 | McCracken | 331/69 |
| 2005/0258913 | A1 | 11/2005 | Ito et al. | |
| 2008/0122547 | A1 | 5/2008 | Ito et al. | |
| 2009/0040011 | A1 | 2/2009 | Yoneda | |

FOREIGN PATENT DOCUMENTS

| JP | 2000-013140 A | 1/2000 |
|---|---|---|
| JP | 2005-033068 A | 2/2005 |
| JP | 2005-341191 | 12/2005 |
| JP | 2007-142165 A | 6/2007 |
| JP | 2008-028620 | 2/2008 |

* cited by examiner

*Primary Examiner* — Arnold Kinkead

(74) *Attorney, Agent, or Firm* — Carrier Blackman & Associates, P.C.; Joseph P. Carrier; William D. Blackman

(57) ABSTRACT

A constant-temperature type crystal oscillator includes: a crystal unit that is installed on one principal surface of a circuit substrate, and chip resistors, which function as heating elements, and which are installed on the other principal surface of the circuit substrate so as to face a principal surface of the crystal unit, the chip resistors heating up the crystal unit to keep an operational temperature of the crystal unit constant. A heating metal film facing the principal surface of the crystal unit is provided on the one principal surface of the circuit substrate. A heat conducting material is interposed between the principal surface of the crystal unit and the heating metal film to perform thermal coupling therebetween. The heating metal film is thermally coupled to electrode terminals of the chip resistors via a plurality of electrode through holes.

5 Claims, 5 Drawing Sheets

BACKGROUND ART

BACKGROUND ART

CONSTANT-TEMPERATURE TYPE CRYSTAL OSCILLATOR

This application claims priority from Japanese Patent Application No. 2008-224560 filed on Sep. 2, 2008, the entire subject matter of which is incorporated herein by reference.

BACKGROUND OF THE INVENTION

1. Field of the Invention

The invention relates to a technical field of a constant-temperature type crystal oscillator (hereinafter called constant-temperature type oscillator) using chip resistors as heating elements, and in particular, to a constant-temperature type oscillator in which the heat conduction property to the crystal unit is enhanced.

2. Description of the Related Art

Constant-temperature type oscillators keep the operational temperatures of their crystal units constant. Therefore, the constant-temperature type oscillators are especially adopted for communication devices for a base station with high frequency stability of, for example, 0.1 ppm or more. JP-A-2005-341191 discloses one example of the constant-temperature type oscillator, for in which downsizing has been attempted by use of chip resistors as heating elements.

FIGS. 4A to 4C are diagrams for explanation of a related art constant-temperature type oscillator. FIG. 4A is a cross-sectional view of the related art constant-temperature type oscillator, FIG. 4B is a view of an oscillator output circuit thereof, and FIG. 4C is a view of a temperature control circuit thereof.

The constant-temperature type oscillator shown in FIGS. 4A to 4C includes an oscillator output circuit 2 including a crystal unit 1 and a temperature control circuit 3. In the constant-temperature type oscillator, respective circuit elements 4 are installed on a first circuit substrate 5a and a second circuit substrate 5b along with the crystal unit 1. Then, the constant-temperature type oscillator is configured to house those in an oscillator case 6. The crystal unit 1 has a crystal element 1a which is formed as, for example, an AT-cut crystal element or an SC-cut crystal element. The crystal element 1a is electrically and mechanically connected to a pair of lead wires 1c of a metal base 1b, and is hermetically encapsulated with a metal cover 1d.

The crystal unit 1 has a frequency-temperature characteristic that approximately 80° C. at the higher temperature side higher than or equal to 25° C. as room temperature is an extreme value, and the oscillating frequency varies according to a temperature in any cases of both of the AT-cut and SC-cut crystal elements. For example, in an AT-cut crystal element, the frequency-temperature characteristic shows a cubic curve (curve A in FIG. 5), and in an SC-cut crystal element, the frequency-temperature characteristic shows a quadratic curve (curve B in FIG. 5). Incidentally, frequency deviation $\Delta f/f$ is plotted along the ordinate of the diagram, where f is a frequency at room temperature, and $\Delta f$ is a frequency difference from the frequency f at room temperature.

The oscillator output circuit 2 is composed of an oscillating stage 2a serving as an oscillator circuit and a buffering stage 2b having a buffer amplifier or the like. The oscillating stage 2a is formed as a Colpitts type circuit having a voltage dividing capacitor (not shown) and transistor for oscillation, that form a resonance circuit along with the crystal unit 1. Here, the oscillating stage 2a is formed as a voltage control type circuit having a voltage-controlled capacitative element 4Cv in an oscillatory loop, for example. In the drawing, Vcc is a power source, Vout is an output, and Vc is a control voltage.

In the temperature control circuit 3, a temperature sensing voltage Vt by a temperature sensing element (for example, thermistor) 4th and a resistor 4r1 is applied to one input terminal of an operational amplifier 40A, and a reference voltage Vr by resistors 4r2 and 4r3 is applied to the other input terminal. Then, a differential voltage between the reference voltage Vr and the temperature sensing voltage Vt is applied to the base of a power transistor 4Tr, and electric power from the power source Vcc is supplied to the chip resistors (hereinafter called heating resistors) 4h serving as heating elements. In this example, the number of heating resistors 4h (4h1, 4h2) is two. Thereby, the supply current to the heating resistors 4h is controlled with a temperature-dependent resistance value of the temperature sensing element 4th, and a quantity of heat from the power transistor 4Tr as well is added thereto to keep the operational temperature of the crystal unit 1 constant.

The first and second circuit substrates 5a and 5b are both made of epoxy materials, and are formed into a multistage (two-stage) structure in which the outer circumferential portion of the first circuit substrate 5a is supported on the second circuit substrate 5b with metal pins 7, and their board faces face each other. The metal pins 7 electrically connect circuit patterns (not shown) on the first and second circuit substrates 5a and 5b. The heating resistors 4h1 and 4h2, the power transistor 4Tr, and the temperature sensing element 4th of the temperature control circuit 3 are installed on (firmly fixed to) the central area which is the top face of the first circuit substrate.

Then, the principal surface of the crystal unit 1 (the principal surface of the metal cover 1d) is installed on these elements 4(h1, h2, Tr, and th) so as to interpose heat conducting resin 8 therebetween. In this case, the power transistor 4Tr which is the highest is disposed on the principal surface at the leading end side of the crystal unit 1 (the metal base 1b), and the temperature sensing element 4th is to be between the heating resistors 4h1 and 4h2. The pair of lead wires 1c led out from the metal base 1b of the crystal unit 1 penetrates through to be connected to the first circuit substrate 5a.

Then, a circuit element 4 for adjustment such as, for example, a trimming capacitor (not shown) is installed on the top face of the first circuit substrate 5a, and the circuit elements 4 of the oscillating stage 2a including the voltage-controlled capacitative element 4Cv having an affect on an oscillating frequency are installed on the top and bottom faces. The second circuit substrate 5b is, for example, a laminated plate having a shielding metal film 9 on its lamination plane, and has mounting terminals 10 on its outer bottom face. Then, the other circuit elements 4 of the buffering stage 2b and the temperature control circuit 3 are installed on the inner bottom face of the second circuit substrate 5b. The oscillator case 6 is formed such that a metal cover 11 is bonded to the second circuit substrate 5b serving as the base as well.

Incidentally, JP-A-2008-28620 also discloses a related art constant-temperature type oscillator.

However, in the constant-temperature type oscillator having the above-described configuration, because not only the heating resistors 4h, but also the power transistor 4Tr as well serves as a heating source, the energy efficiency of the power source is enhanced, meanwhile, the power transistor 4Tr is greater in height than the heating resistors 4h1 and 4h2, which generates a step between those. Accordingly, the thickness of the heat conducting resin 8 interposed between the crystal unit 1 and the heating resistors 4h1 and 4h2 as well is increased, and heat loss through the heat conducting resin 8 is generated, which results in the problem of a lack of efficiency of heat conduction.

Further, with respect to the crystal unit 1, the lead wires 1c led out from the metal base 1b are bent to be connected to the first circuit substrate 5a. Then, the principal surface of the crystal unit 1 is installed (laminated) so as to face the heating resistors 4h so as to include the power transistor 4Tr, which results in the problem that the oscillator is basically increased in height size.

For this reason, as shown in JP-A-2005-341191, for example, a circuit substrate is made of ceramic, and a crystal unit formed for surface mounting is installed on one principal surface of the circuit substrate, and heating resistors facing the crystal unit are installed on the other principal surface. Thereby, the crystal unit and the heating resistors are installed on both principal surfaces of the circuit substrate so as not to be laminated, which reduces the oscillator in height size. Then, because heat from the heating resistors is conducted to the principal surface (the bottom face) of the crystal unit by utilizing the heat conducting property of the ceramic (the circuit substrate), it is possible to heat up the crystal unit.

However, in this case, the ceramic is applied as a heat conducting material, meanwhile, the heat conductivity of ceramic is approximately less than or equal to $\frac{1}{10}$ of that of metal, which results in the problem of a lack of efficiency of heat conduction. Then, because the power transistor is not used as a direct heat source, there has been the problem of a decrease in energy efficiency as well.

SUMMARY OF THE INVENTION

An object of the invention is to provide a constant-temperature type oscillator, which can reduce a height size thereof, and which can improve efficiency of heat conduction.

According to a first aspect of the invention, there is provided a constant-temperature type crystal oscillator comprising: a crystal unit that is installed on one principal surface of a circuit substrate; and chip resistors, which function as heating elements, and which are installed on the other principal surface of the circuit substrate so as to face a principal surface of the crystal unit, the chip resistors heating up the crystal unit to keep an operational temperature of the crystal unit constant, wherein a heating metal film facing the principal surface of the crystal unit is provided on the one principal surface of the circuit substrate, wherein a heat conducting material is interposed between the principal surface of the crystal unit and the heating metal film to perform thermal coupling therebetween, and wherein the heating metal film is thermally coupled to electrode terminals of the chip resistors via a plurality of electrode through holes.

According to a second aspect of the invention, in the constant-temperature type crystal oscillator, wherein a power transistor for supplying electric power to the chip resistors and a conducting metal film, which is extended in width, and which is conducted to the heating metal film, are disposed on the one principal surface of the circuit substrate, and wherein a collector of the power transistor is connected to the heating metal film through the conducting metal film extended in width.

According to a third aspect of the invention, in the constant-temperature type crystal oscillator, wherein the chip resistors include electrodes on both sides along their long sides, and wherein the chip resistors are composed of two resistors disposed such that the long sides face each other, and wherein a temperature sensing element is disposed between the chip resistors.

According to the aspects of the invention, since the crystal unit and the heating resistors are disposed on the surfaces opposite to one another of the circuit substrate, the oscillator can be kept low in height size. Then, heat from the heating resistors installed on the other principal surface is directly conducted to the metal film on the one principal surface of the circuit substrate via electrode through holes. Then, the heat is conducted from the metal film to the principal surface of the crystal unit facing the metal film via the heat conducting material. Accordingly, since metal with heat conductivity ten times or more as high as that of ceramic, is applied as a heat conducting material, it is possible to enhance the efficiency of heat conduction from the heating resistors to the crystal unit via the metal film.

Further, according to the second aspect of the invention, heat from the power transistor is also added to the heat source. Therefore, heat energy can be effectively used in the same way as in the related art.

Still further, according to the third aspect of the invention, heat from the chip resistors is conducted via the electrodes along their long sides. Therefore, the heat conduction can be more efficient than a case in which the electrodes are provided along their short sides.

BRIEF DESCRIPTION OF THE DRAWINGS

FIGS. 1A to 1C are diagrams for explanation of a constant-temperature type crystal oscillator according to one embodiment of the invention, in which FIG. 1A is a cross-sectional view of the constant-temperature type oscillator, FIG. 1B is a plan view (top view) of a first circuit substrate of the constant-temperature type oscillator, and FIG. 1C is a plan view of a heating resistor of the constant-temperature type oscillator;

FIGS. 4A to 4C are diagrams for explanation of a related art constant-temperature type oscillator, in which FIG. 4A is a cross-sectional view of the related art constant-temperature type oscillator, FIG. 4B is a view of an oscillator output circuit of the related art constant-temperature type oscillator, and FIG. 4C is a view of a temperature control circuit of the related art constant-temperature type oscillator.

DETAILED DESCRIPTION OF THE PREFERRED EMBODIMENTS

Figure 1A:
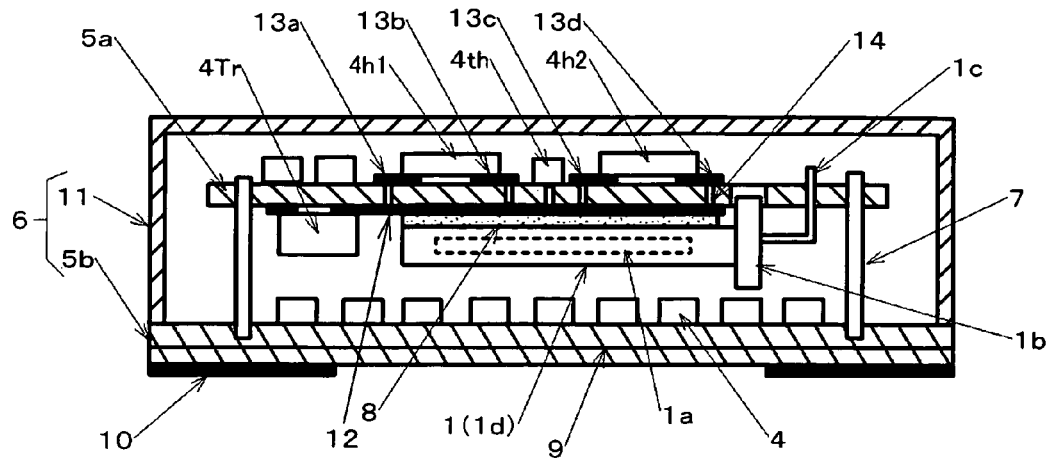
Figure 1B:
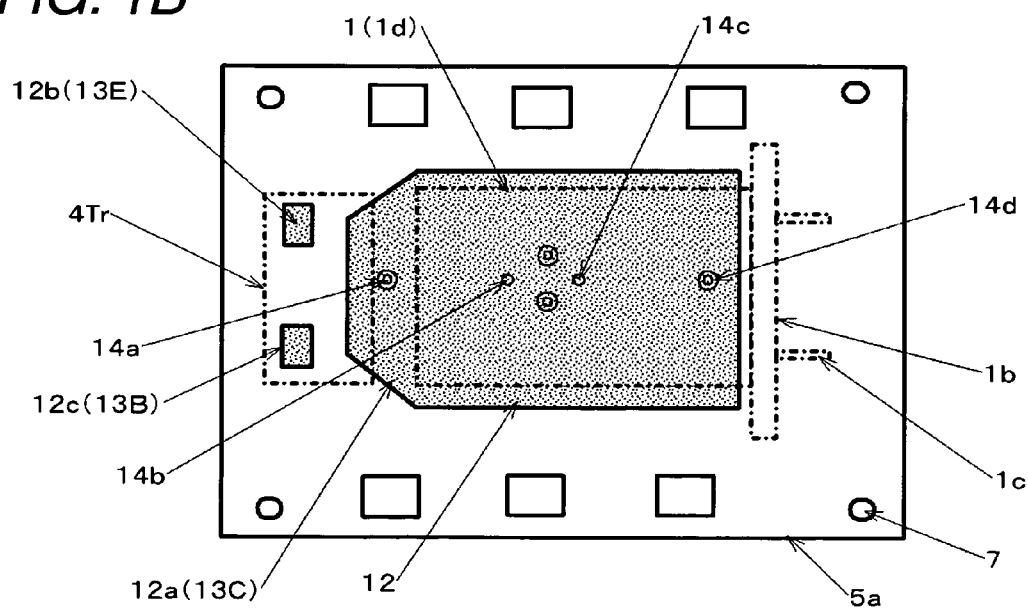
Figure 1C:
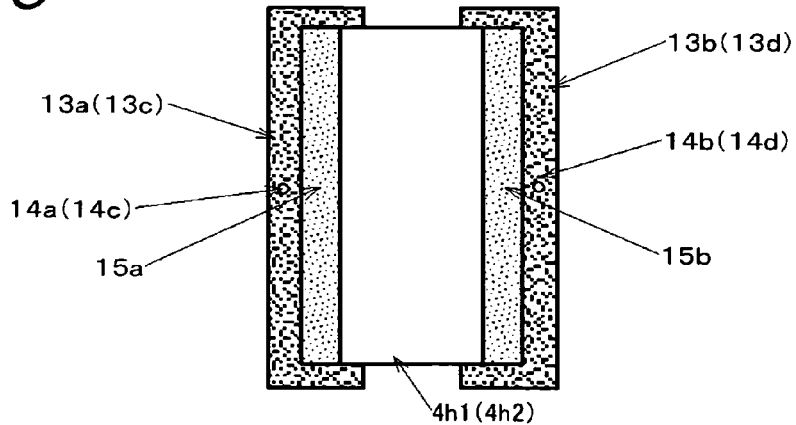

FIGS. 1A to 1C are diagrams for explanation of a constant-temperature type crystal oscillator according to one embodiment of the invention. FIG. 1A is a cross-sectional view of the constant-temperature type oscillator, FIG. 1B is a plan view (top view) of a first circuit substrate thereof, and FIG. 1C is a plan view of a heating resistor thereof. Incidentally, portions which are the same as those in the related example are denoted by the same symbols, and descriptions thereof will be simplified or omitted.

Figure 4A:
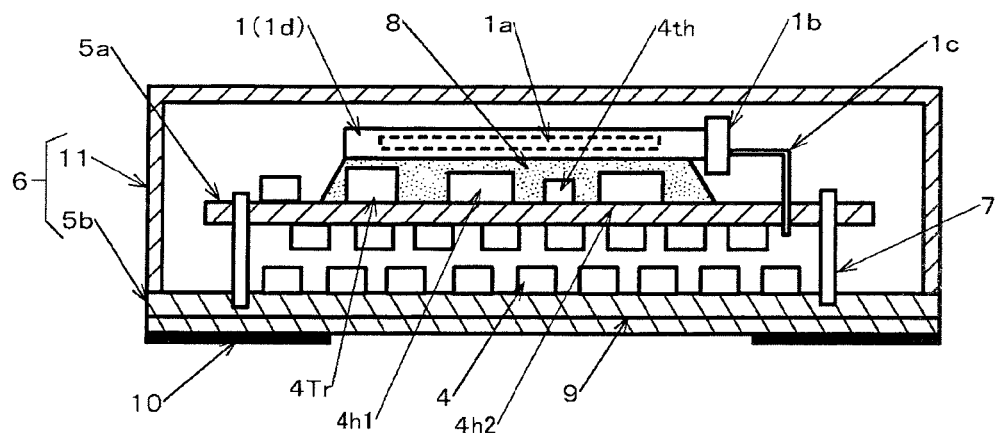
Figure 4B:
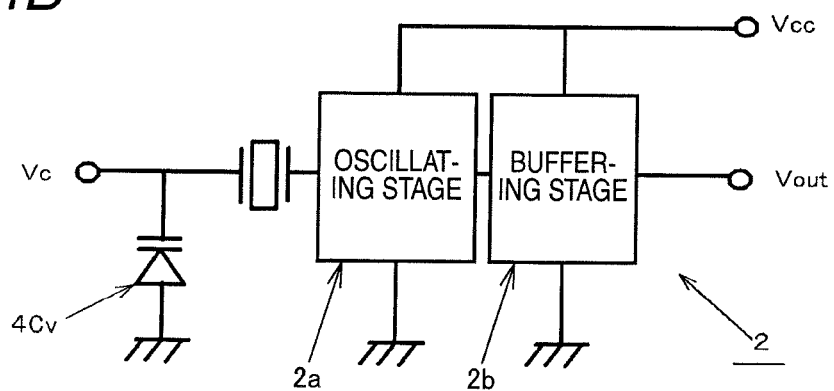
Figure 4C:
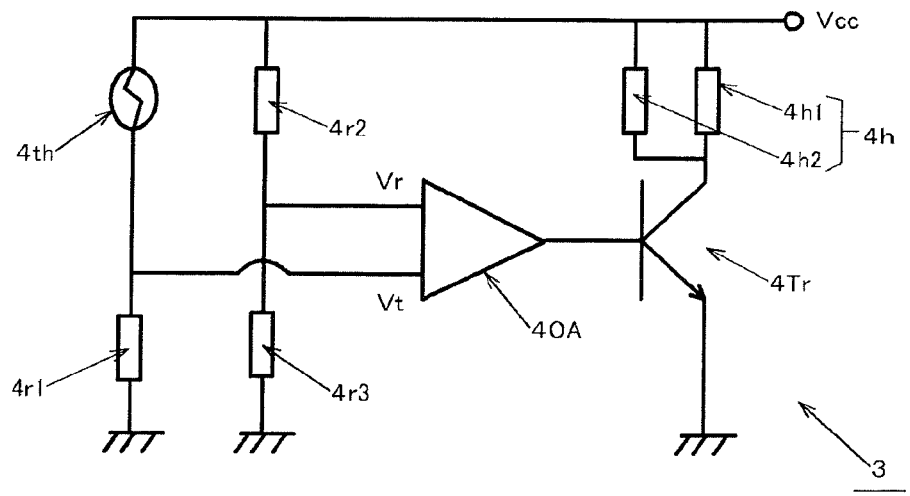
Figure 5:
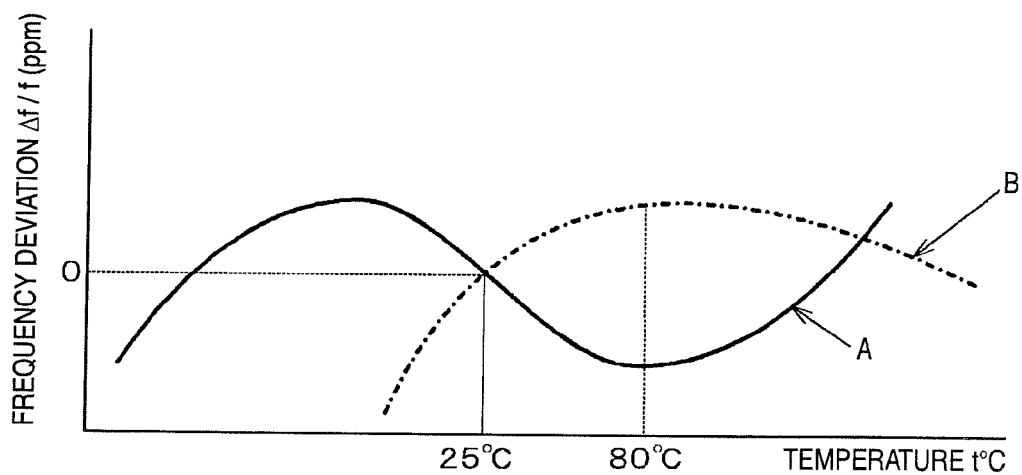
FIG. 5 is a frequency-temperature characteristic diagram of a crystal unit according to the related art constant-temperature type crystal oscillator.

As described above, the constant-temperature type oscillator has a circuit configuration having the crystal unit 1, the oscillator output circuit 2, and the temperature control circuit 3 (refer to FIGS. 4A to 4C). Incidentally, the temperature control circuit 3 functions as a temperature compensation circuit of the crystal unit 1. The crystal unit 1 and the respective circuit elements 4 are installed on the first and second circuit substrates 5a and 5b which are both made of epoxy materials. The second circuit substrate 5b has the mounting terminals 10, and serves as a base of the oscillator case 6 as well, and the metal cover 11 is bonded to the second circuit substrate 5b.

The crystal unit 1 is installed as a bottom face of the first circuit substrate 5a in contrast to the above description, the power transistor 4Tr is also on the bottom face of the first circuit substrate 5a, and the two heating resistors 4h1 and 4h2, and the temperature sensing element 4th are installed on the top face thereof as described above. However, an adjuster element such as a trimming capacitor as well is installed on the top face. Then, the circuit elements 4 of, in particular, the oscillating stage 2a having an affect on an oscillating frequency are installed on the top and bottom faces of the first circuit substrate 5a.

Further, the circuit elements 4 of the buffering stage 2b and the temperature control circuit 3 having little effect on an oscillating frequency are installed on the second circuit substrate 5b.

The metal film 12 is formed on the central area of the bottom face of the first circuit substrate 5a, and the principal surface of the crystal unit 1 (the metal cover 1d) is installed to face the metal film 12. The protruded outer circumferential portion of the metal base 1b of the crystal unit 1 is inserted into a notched part (without numbering) provided in the first circuit substrate 5a, and the heat conducting resin 8 formed to be sheet-shaped is interposed between the principal surface of the crystal unit 1 and the metal film 12 to firmly adhere thereto. Then, the metal film 12 has a projecting portion 12a projecting from the side of the leading end of the crystal unit 1 (the leading end side of the metal cover 1d), to gradually narrow.

The heating resistors 4h1 and 4h2 are formed into rectangular shapes long in one direction, and both have electrode terminals 15a and 15b on both sides along the long side directions. Then, the electrode terminals 15a and 15b of the heating resistors 4h1 and 4h2 are connected to respective circuit terminals (13a, 13b) and (13c, 13d) formed on the top face of the first circuit substrate 5a with a solder (not shown). The respective circuit terminals (13a, 13b) and (13c, 13d) are led out to the bottom face of the first circuit substrate 5a via electrode through holes (14a, 14b) and (14c, 14d). Then, the circuit terminals 13b and 13c, which are respectively at the inner sides of the respective circuit terminals (13a, 13b) and (13c, 13d), are connected to the metal film 12 provided on the bottom face. In contrast thereto, the circuit terminals 13a and 13d, which are respectively at the outer sides of the respective circuit terminals (13a, 13b) and (13c, 13d), are independent of the metal film 12, to be not connected thereto.

Figure 2:
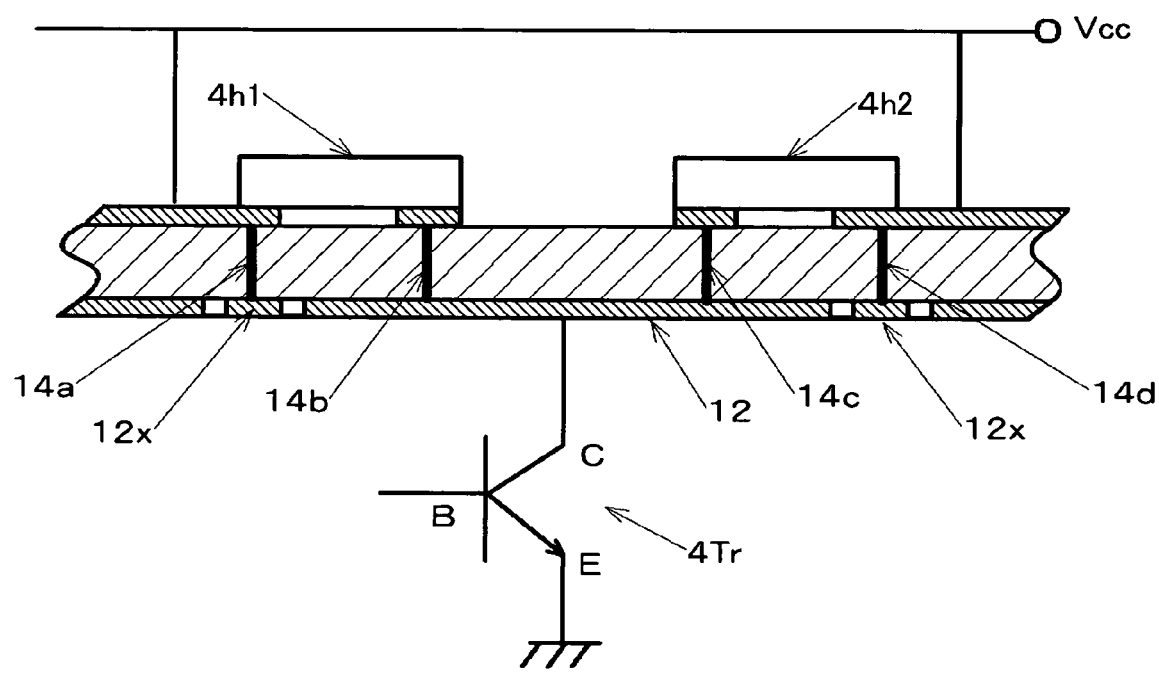
FIG. 2 is a partial schematic view showing wire connections between the first circuit substrate and a temperature control circuit of the constant-temperature type oscillator.

That is, as shown in a partial diagrammatic view as FIG. 2, the one terminals of the heating resistors 4h1 and 4h2, which are at the collector side of the power transistor 4Tr, are conducted to the metal film 12 via the electrode through holes 14b and 14c, to have a common connection. That is, the metal film 12 functions as an electrically-conducting path through which the collector of the power transistor 4Tr and the one terminals of the heating resistors 4h1 and 4h2 are connected, and heat from the heating resistors 4h1 and 4h2 is directly conducted to the metal film 12. In contrast thereto, the other terminals of the heating resistors 4h1 and 4h2, which are at the side of the power source (Vcc), are connected to an annular electrode 12x. However, the other terminals of the heating resistors 4h1 and 4h2 are not conducted, to be not connected to the metal film 12. However, the other terminals of the heating resistors 4h1 and 4h2 are electrically connected to the power source (Vcc) via a line path (not shown) on the top face.

As shown in FIGS. 1A to 1C, the projecting portion 12a of the metal film 12 and two metal films 12b and 12c facing the projecting portion 12a serve as circuit terminals 13(C), 13(E) and 13(B) to which the collector (C), the emitter (E), and the base (B) of the power transistor 4Tr are respectively connected. Then, the respective electrode terminals of the power transistor 4Tr formed as a surface mounting type are connected to the circuit terminals 13(C), 13(E) and 13(B).

According to such a configuration, heat from the heating resistors 4h1 and 4h2 is directly conducted to the metal film 12 entirely facing the principal surface of the crystal unit 1 via the electrode through holes 14b and 14c respectively connected to the one electrode terminals thereof. Then, since the principal surface of the crystal unit 1 and the metal film 12 firmly adhere to each other with the heat conducting resin 8, the heat from the metal film 12 is conducted to the crystal unit 1 without any loss of heat. In this case, since the projecting portion of the metal base 1b of the crystal unit 1 is inserted into the notched part of the first circuit substrate 5a, it is possible to minimize the thickness of the heat conducting resin 8. Accordingly, it is possible to minimize loss of heat through the heat conducting resin 8 to enhance the effect of heat conduction.

Further, here, with respect to the other terminals of the heating resistors 4h1 and 4h2, heat therefrom is conducted to the bottom face of the first circuit substrate 5a via the electrode through holes 14a and 14b. Then, in this example, in particular, the other terminals of the heating resistors 4h1 and 4h2 are not connected to the metal film 12, but connected to the annular electrode 12x. Accordingly, heat from the annular electrode 12x as well is conducted to the principal surface of the crystal unit 1 via the heat conducting resin 8 firmly adhering to the annular electrode 12x, which further enhances the effect of heat conduction. However, the effect of heat conduction is enhanced even without the annular electrode 12x.

Then, since the heating resistors 4h1 and 4h2 have the electrode terminals 15a and 15b on both sides along their long sides, heat radiation from the heating resistors 4h1 and 4h2 is made more efficient as compared with a case in which the electrode terminals 15a and 15b are provided on both sides along their short sides. Moreover, the collector (C) of the power transistor 4Tr is connected to the projecting portion 12a (one example of a conducting metal film) extended in width to directly conduct heat to the metal film 12. Accordingly, since heat generated from the collector resistance of the power transistor 4Tr as well is utilized, energy efficiency is enhanced.

Then, the heating resistors 4h1 and 4h2, and the temperature sensing element 4th are on the top face of the first circuit substrate 5a and the crystal unit 1 is on the bottom face thereof. Accordingly, as compared with the case in which the principal surface of the crystal unit and the power transistor 4Tr are disposed on the top face of the power transistor 4Tr, the heating resistors 4h1 and 4h2, and the temperature sensing element 4th as in the related example, it is possible to reduce the oscillator in height size even in the case in which the crystal unit 1 having the lead wires 1c is used.

MODIFIED EXAMPLES

In the above-described embodiment, the electrode through holes 14 are provided one by one to each of the respective electrode terminals 15a and 15b of the heating resistors 4h1 and 4h2. However, a plurality of the electrode through holes 14 may be provided to each of those, to enhance the efficiency of heat conduction. Further, the respective chip resistors 4h1 and 4h2 are provided in parallel with the power transistor 4Tr.

Figure 3:
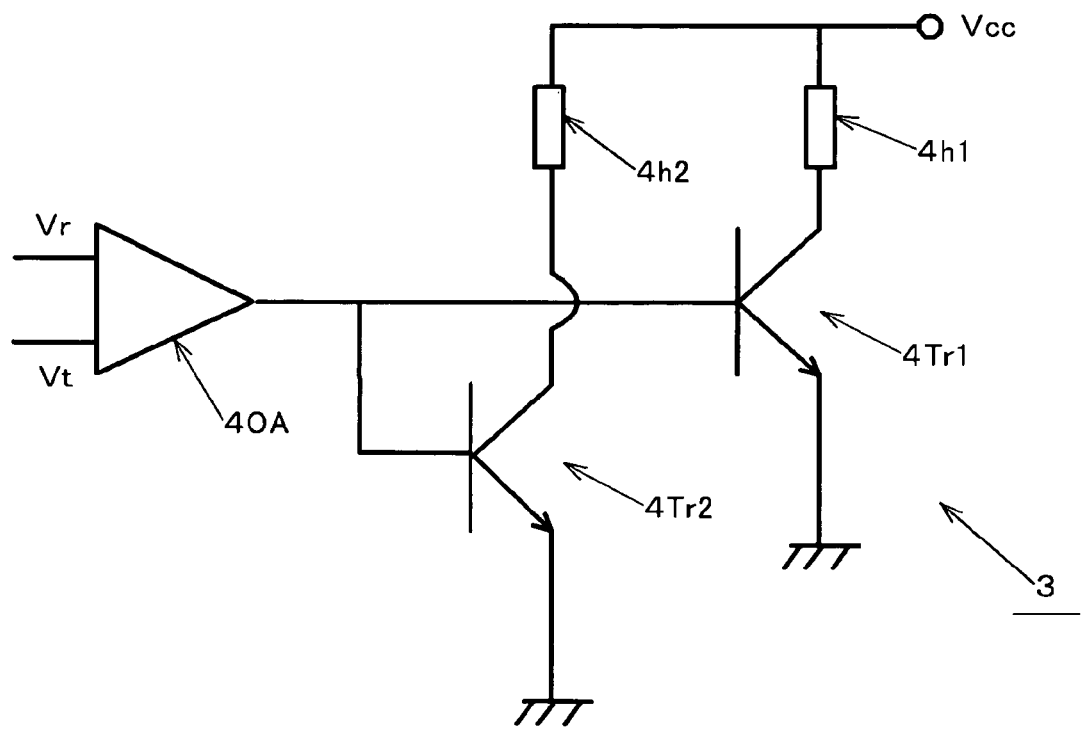
FIG. 3 is a partial schematic view of the temperature control circuit for explanation of another application example according to the invention.

However, as shown in FIG. 3, for example, power transistors 4Tr1 and 4Tr2 may be provided to each of the respective chip resistors 4h1 and 4h2. Those are determined according to the specification or the like of the power transistor 4Tr.

Further, the heating resistors 4h are two. However, the number of heating resistors 4h may be randomly determined as needed. Then, the constant-temperature type oscillator is formed as a surface mounting type. However, the constant-temperature type oscillator may be applied to a type in which lead wires are led out from a metal base (not shown). In particular, any constant-temperature type oscillator primarily having the substrate configuration of the first circuit substrate 5a is incorporated in the technical scope of the invention.

What is claimed is:

1. A constant-temperature type crystal oscillator comprising:
    a crystal unit that is installed on one principal surface of a circuit substrate; and
    chip resistors, which function as heating elements, and which are installed on the other principal surface of the circuit substrate so as to face a principal surface of the crystal unit, the chip resistors heating up the crystal unit to keep an operational temperature of the crystal unit constant,
    wherein a heating metal film facing the principal surface of the crystal unit is provided on the one principal surface of the circuit substrate,
    wherein a heat conducting material is interposed between the principal surface of the crystal unit and the heating metal film to perform thermal coupling therebetween,
    wherein the heating metal film is thermally coupled to electrodes of the chip resistors via a plurality of electrode through holes,
    wherein the heating metal film includes a projecting portion,
    wherein a power transistor for supplying electric power to the chip resistors is disposed on the one principal surface of the circuit substrate, and
    wherein a collector of the power transistor is connected to the projecting portion of the heating metal film.

2. A constant-temperature type crystal oscillator comprising:
    a crystal unit that is installed on one principal surface of a circuit substrate; and
    chip resistors, which function as heating elements, and which are installed on the other principal surface of the circuit substrate so as to face a principal surface of the crystal unit, the chip resistors heating up the crystal unit to keep an operational temperature of the crystal unit constant,
    wherein a heating metal film facing the principal surface of the crystal unit is provided on the one principal surface of the circuit substrate,
    wherein a heat conducting material is interposed between the principal surface of the crystal unit and the heating metal film to perform thermal coupling therebetween,
    wherein the heating metal film is thermally coupled to electrodes of the chip resistors via a plurality of electrode through holes,
    wherein each of the chip resistors has long sides and short sides when viewed in plan,
    wherein the chip resistors include the electrodes on both sides along their long sides, and
    wherein the chip resistors are composed of two resistors disposed such that the long sides face each other, and
    wherein a temperature sensing element is disposed between the chip resistors.

3. The constant-temperature type crystal oscillator according to claim 2, wherein only the electrodes on the long sides of the chip resistors that face each other are coupled to the heating metal film via the plurality of electrode through holes.

4. The constant-temperature type crystal oscillator according to claim 3, wherein an annular electrode is also provided on the one principal surface of the circuit substrate, and the electrodes on the long sides of the chip resistors that do not face each other are coupled to the annular electrode via other electrode through holes formed in the circuit substrate.

5. The constant-temperature type crystal oscillator according to claim 2, wherein circuit terminals are provided on the other principal surface of the substrate respectively beneath each of the long sides of the chip resistors, the electrodes on the long sides of the chip resistors are connected to the circuit terminals, and the circuit terminals are coupled to the heating metal film via the plurality of electrode through holes.

* * * * *